United States Patent
Henley et al.

Patent Number: 6,083,324
Date of Patent: Jul. 4, 2000

[54] GETTERING TECHNIQUE FOR SILICON-ON-INSULATOR WAFERS

[75] Inventors: Francois J. Henley, Los Gatos; Nathan W. Cheung, Albany, both of Calif.

[73] Assignee: Silicon Genesis Corporation, Los Gatos, Calif.

[21] Appl. No.: 09/025,964

[22] Filed: Feb. 19, 1998

Related U.S. Application Data

[60] Provisional application No. 60/053,239, Jul. 18, 1997.

[51] Int. Cl.⁷ .................................................. H01L 21/322
[52] U.S. Cl. ........................................... 148/33.2; 438/473
[58] Field of Search .................................... 438/471, 473, 438/474, 475, 455, 458, 459; 148/33, 33.2, 33.3, 33.4; 257/347, 349, 352

[56] References Cited

U.S. PATENT DOCUMENTS

| | | |
|---|---|---|
| 5,198,371 | 3/1993 | Li . |
| 5,374,564 | 12/1994 | Bruel . |
| 5,443,661 | 8/1995 | Oguro et al. . |

OTHER PUBLICATIONS

Chu et al., "Recent applications of plasma immersion ion implantation", Semiconductor International pp. 165–172, Jun. 1996.

*Primary Examiner*—Charles Bowers
*Assistant Examiner*—Keith Christianson
*Attorney, Agent, or Firm*—Townsend and Townsend and Crew LLP

[57] ABSTRACT

A gettering layer in a silicon-on-insulator wafer. The gettering layer may be formed by implanting gas-forming particles or precipitate-forming particles beneath the active region of the silicon layer and thermally treating the gas-forming ions to produce microbubbles or precipitates within the silicon layer. The microbubbles an/or precipitates create trapping sites for mobile impurity species, thus gettering the impurities. In another embodiment, a polysilicon layer is formed on a donor silicon wafer prior to separating a thin layer of silicon from the donor wafer. The thin layer of silicon is bonded to a backing wafer, the polysilicon layer provides a gettering layer between the active silicon and the backing wafer.

26 Claims, 9 Drawing Sheets

GETTERING TECHNIQUE FOR SILICON-ON-INSULATOR WAFERS

CROSS REFERENCE TO RELATED APPLICATIONS

This application claims priority from the provisional patent application entitled GETTERING TECHNIQUE FOR SILICON-ON-INSULATOR WAFERS, filed Jul. 18, 1997 and assigned application Ser. No. 60/053,239.

BACKGROUND OF THE INVENTION

The present invention relates to the manufacture of integrated circuits. More particularly, the present invention provides a technique for providing a gettering layer in a silicon-on-insulator wafer, for example.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip.

An approach to achieving very-large scale integration (VLSI) or ultra-large scale integration (ULSI) is by using a semiconductor-on-insulator (SOI) wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. However, many problems that have already been solved regarding fabricating devices on bulk silicon wafers remain to be solved for fabricating devices on SOI wafers.

Numerous limitations, however, still exist with the fabrication of SOI wafers. For example, devices within integrated circuits in SOI wafers are very sensitive to the presence of even minute concentrations of some impurities. For example, metals, such as copper, nickel, silver, gold, or iron, within the active region of a device typically degrade several device characteristics, including leakage current and oxide breakdown voltage. These and other metals rapidly diffuse through silicon at temperatures typical of semiconductor device fabrication processes. These impurities often become trapped in the active region of the SOI wafer. That is, the SOI wafer includes a dielectric layer or insulating layer underlying the active region that tends to keep impurities in the active layer, rather than diffusing down into the bulk silicon. Accordingly, SOI wafers are prone to device and reliability problems caused by the presence of impurities that cannot diffuse out of the active region.

From the above, it is seen that a technique for removing impurities from active regions of an integrated circuit made on an SOI wafer is highly desirable.

SUMMARY OF THE INVENTION

According to the present invention, a technique including a method and device for removing impurities from an SOI wafer is provided. In an exemplary embodiment, the present invention provides an SOI wafer with a gettering layer for removing impurities from an active region. This gettering layer removes impurities from the device, thereby preventing a possibility of quality and reliability problems, e.g., lowered breakdown voltage, increased leakage current, and the like. Accordingly, the invention provides, for example, "lifetime" control of impurities in the device.

In a specific embodiment, a process for forming an SOI wafer using a novel implanting step(s) is provided. The method includes a step of providing an SOI wafer, such as one made by a process commonly termed separation by implanted oxygen (SIMOX). The method then implants (e.g., by ion beam implantation or plasma immersion ion implantation) particles or gas-forming particles or ions, such as hydrogen or rare-gas ions, beneath the wafer surface of the wafer but above the insulating layer, i.e., the oxide layer. The wafer is thermally processed so that the implanted particles or gas-forming ions create, for example, microbubbles or precipitates (e.g. implant induced precipitates) in the wafer. These microbubbles or precipitates act as gettering sites for impurities in the silicon layer of the SIMOX wafer. Alternatively, the particles can act as gettering sites for impurities. The gettering sites can remove impurities such as, for example, metals.

In an alternative embodiment, the present invention provides an SOI wafer made by way of a bonding process with a gettering layer. The process includes a step of providing an SOI wafer, where the thin layer of material (e.g., silicon) was bonded onto an insulating layer. Gas-forming ions or particles are implanted into the thin layer of material. The SOI wafer is thermally processed so that the implanted particles or gas-forming ions create, for example, microbubbles or precipitates in the wafer. These microbubbles act as gettering sites for impurities in the thin layer of material. Alternatively, the particles act as gettering sites for the impurities. The thin layer of material has been separated from, for example, a bulk donor silicon wafer by an implantation blister method, commonly termed "Smart Cut".

A further embodiment of the present invention provides an SOI wafer made by way of a bonding process with a gettering layer on the surface of the thin layer of material that is bonded to an insulating layer. The gettering layer can, for example, a layer of polysilicon formed on a bulk monocrystalline silicon donor wafer. The thin layer of material, including the gettering layer, has been separated from, for example, a bulk donor silicon wafer by a Smart Cut process. A gettering layer, such as a layer of polysilicon, on the thin layer, such as a layer of monocrystalline silicon, can provide effective gettering after a different time-temperature product, i.e. thermal budget, than microbubbles. Thus, a gettering layer on the thin layer can be used in addition to or alternatively to microbubble or particle gettering sites.

Numerous benefits are achieved by way of the present invention over pre-existing techniques. These benefits include, among others, gettering of impurities from active regions of an integrated circuit device made on an SOI wafer. Additionally, the present invention occurs by way of improved processing techniques using PIII, for example. PIII is relatively cost effective, easy to use and in some instances produces less impurity metal contamination than other ion implantation techniques. Furthermore, the present invention provides for "lifetime" engineering of the device by way of the gettering layer. These and other benefits are described throughout the specification.

These and other embodiments of the present invention, as well as its advantages and features are described in more detail in conjunction with the text below and attached figures.

DESCRIPTION OF SPECIFIC EMBODIMENTS

Figure 1A:
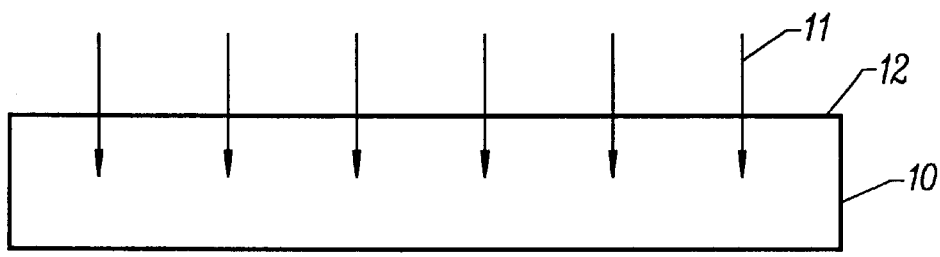
FIGS. 1A–1D are simplified cross sections of a SIMOX wafer being fabricated according to an embodiment of the present invention.

The present invention provides an SOI wafer with a gettering layer for removing impurities from an active region of an integrated circuit to be formed on the wafer. In a specific embodiment, a gettering layer is formed in an SOI wafer. The gettering layer is generally beneath an active region of the devices that will be formed on the SOI wafer. The SOI wafer can be made using a variety of techniques including SIMOX, a process called "Smart-Cute™", "Smarter-Cut", and others.

I. SIMOX Wafer Embodiments

FIGS. 1A–1D are simplified cross sections of a SIMOX wafer according to an embodiment of the present invention. The drawings are not to scale and are merely illustrations, which should not limit the scope of the claims herein. Like features in the drawings are indicated with like number designations in most cases. A process sequence according to the present invention is summarized in the simplified flow chart shown in FIG. 2.

Figure 2:
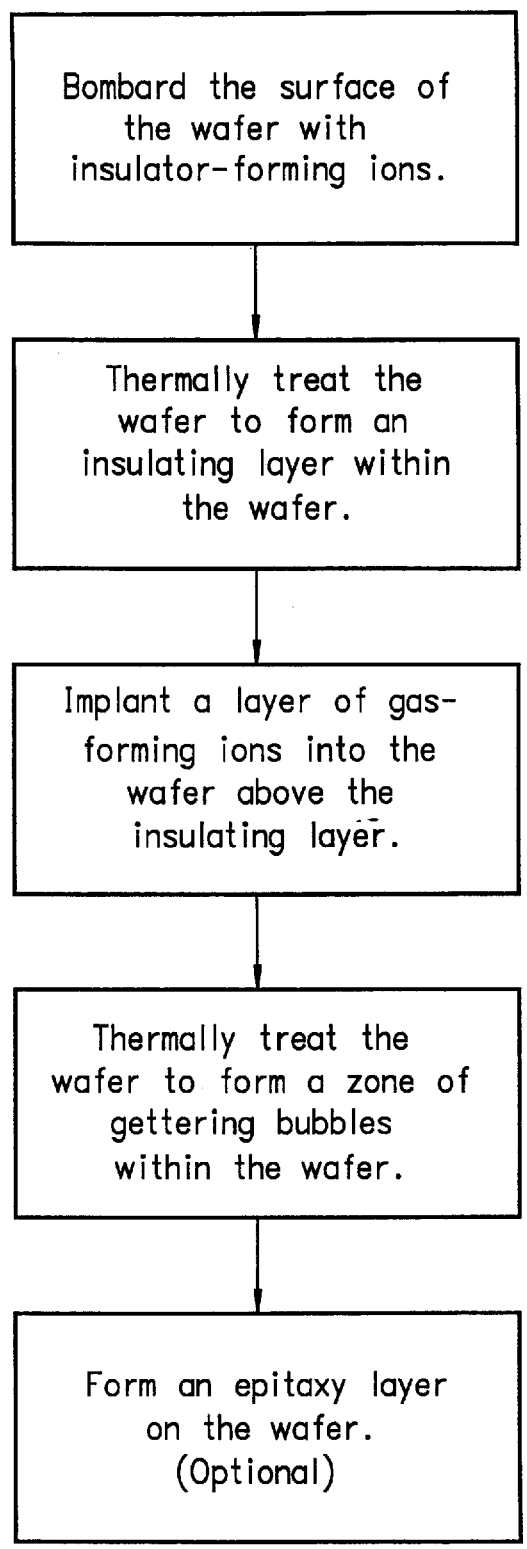
FIG. 2 is a simplified flow chart of a process in accordance with FIGS. 1A–1D.

FIG. 1A shows a simplified cross section of a bulk silicon wafer 10 being implanted with oxygen ions 11. The intent is to implant sufficient oxygen ions so that an insulating layer of silicon oxide forms beneath a top surface 12 of the wafer. This technique requires a relatively high dose of oxygen ions to be implanted relatively deep into the bulk silicon wafer. For example, a dose of about $2 \times 10^{18}$ cm$^{-2}$ oxygen ions implanted into a silicon wafer at an energy of about 150–180 keV will provide sufficient oxygen to form an insulating layer about 0.3–0.5 μm below the top surface of the wafer. The wafer is typically kept at a temperature of at least 550° C. during the implant to maintain the crystalline structure of the wafer during the high-dose implantation. After the implantation, the wafer is annealed to form an insulating layer of silicon oxide from the implanted oxygen ions. Annealing the wafer at 1100–1175° C. for 3–5 hours in a nitrogen ambient is one example of a suitable anneal step. It is understood that other insulator-forming ions could be implanted, such as nitrogen, and that it is not necessary for the wafer to be monocrystalline, or even silicon. For example, the wafer could be germanium, silicon carbide, or a silicon-germanium alloy, among other choices.

Figure 1B:
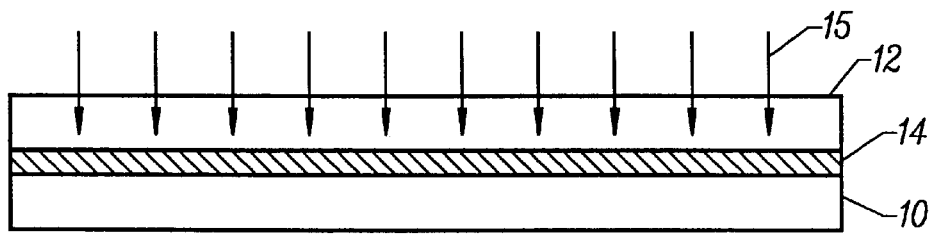

FIG. 1B shows an insulating layer 14 beneath the top surface 12 of the wafer 10. Gas-forming or precipitate-forming particles, such as ions or charged atoms or molecules, 15 are implanted into the wafer beneath the top surface of the wafer, but above the insulating layer. The particles generally do not significantly react with the substrate that they are implanted into, but rather form gas pockets, also known as microbubbles, or precipitates within the substrate after suitable thermal treatment. Examples of gas-forming particles include hydrogen ions and ions formed from the noble gases, including helium, neon, argon, krypton, and xenon. Examples of precipitate-forming particles include oxygen, carbon, and nitrogen. These microbubbles or precipitates provide trapping sites for impurities. It is believed that the internal surfaces of these microbubbles provide a lower energy state for impurities, and also that the formation of the bubbles may create localized crystalline defects, providing further trapping sites. It has been estimated that the interior surface of a microbubble may trap a copper impurity ion by providing a site that is about 2.2 eV lower in energy than the bulk solution site for copper ions.

Figure 1C:
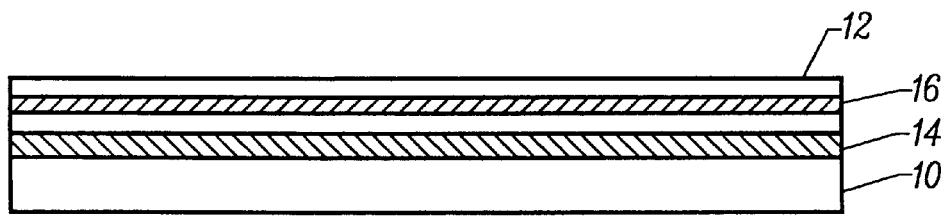

FIG. 1C shows a gettering layer 16 between the insulative layer 14 and the top surface 12 of the wafer 10. It is understood that the gettering layer 16 is a region of gettering sites within the wafer and that characterizing this region as a layer is done for illustrative purposes only. The distribution of these gettering sites depends upon the energies used to implant the particles, among other factors. In this instance, the gettering layer is made up of several microbubbles distributed over a range of depth from the top surface of the wafer. The microbubbles formed after thermally treating the implanted gas-forming particles. The choice of ion dosage and energy to form the gettering layer depends upon many factors, including the depth of the insulative layer, the type of semiconductor material the gettering layer is to be formed in, the bubble-forming species, and the intended device type and active region, among other factors. As an example, $1\times10^{17}$ cm$^{-2}$ helium ions implanted into a {100} silicon wafer at 30 keV and annealed for one-half hour at 700° C. resulted in a layer of microbubbles in the silicon wafer about 0.3 μm below the top surface of the wafer. The bubbles had an average diameter of about 8 nm. Annealing for longer periods of time or at a higher temperature resulted in larger bubbles being formed, resulting in a reduction of total microbubble surface area. High-temperature annealing also generally reduces the dislocations, stacking faults, and other crystal imperfections associated with microbubble gettering. The implantation of gas-forming ions, as well as the implantation of insulator-forming ions, may be performed by a variety of means, including ion beam implantation and plasma immersion ion implantation (PIII).

In an alternative embodiment, the ions or particles are implanted into region 16 using a pattern. For example, the pattern can be formed by a "shadow" mask or masking and photolithography steps. Additionally, a variety of patterns can be used depending upon the applications. For instance, the patterns can be in the form of a plurality of strips, numerous concentric circles, a checkerboard, and others. Alternatively, the implanted region can be specifically placed in to be non-active regions of the device. These non-active regions include, among others, field isolation oxide regions, peripheral regions of the device, and "streets." Of course, the type of pattern used depends highly upon the application.

Figure 1D:
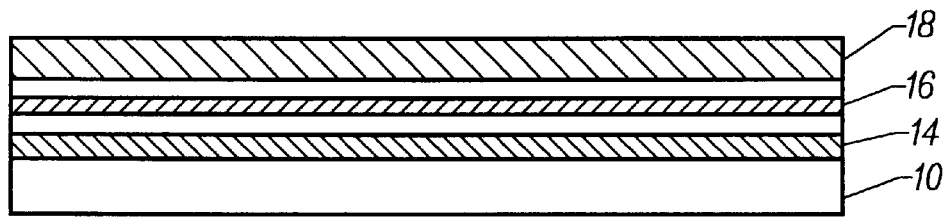

FIG. 1D shows an epitaxial layer 18 on top of the wafer 10. The epitaxial layer is optional for some applications, and provides a thicker silicon layer to fabricate the active devices in, or for other purposes. In some instances, the epitaxial layer is formed before the gettering layer, in other instances, it is formed after the gas-forming particles are implanted. The epitaxial layer may be formed by a variety of well-known means.

Figure 3:
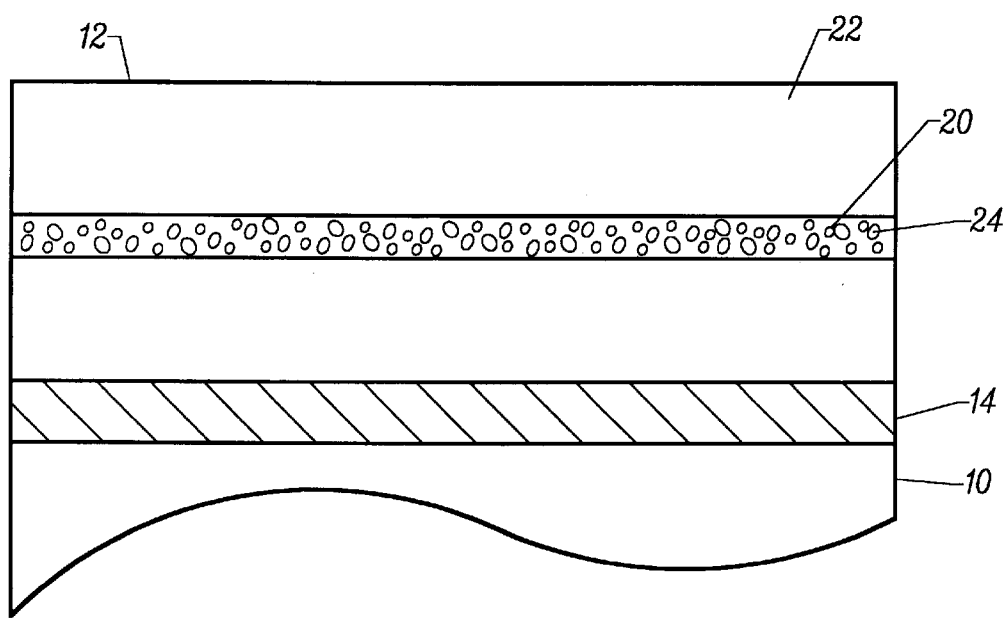
FIG. 3 is a simplified view of a SIMOX wafer with a gettering layer of microbubbles, showing the interior surfaces of the microbubbles.

FIG. 3 is a simplified cross section of the SIMOX wafer showing microbubbles 20 in the gettering layer 24. The gettering layer lies between an active layer 22 with a top, or upper, surface 12 and the insulating layer 14. The microbubbles have interior surfaces 24 to trap mobile impurity species, as discussed above.

II. Wafer-bonded SOI Wafer with a Gettering Layer of Microbubbles

FIGS. 4A–4E are simplified cross sections of an SOI wafer with a gettering layer being fabricated according to a wafer bonding process. A wafer bonding process involving an implantation blister method, such as a process known as "Smart Cut," is described, but it is understood that other wafer bonding methods, such as slicing and backlapping or back etching, may be used. An example of an implantation blister method is described in U.S. Pat. No. 5,374,564, entitled Process For The Production Of Thin Semiconductor Material Films, by Michel Bruel, issued Dec. 20, 1994. The process sequence of FIGS. 4A–4E is summarized in the simplified flow chart shown in FIG. 5.

Figure 4A:
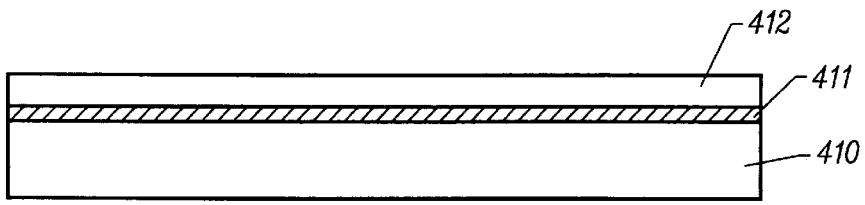
FIGS. 4A–4E are simplified cross sections of an SOI wafer being fabricated with a gettering layer of microbubbles, the SOI process including blister separation and wafer bonding steps.
Figure 5:
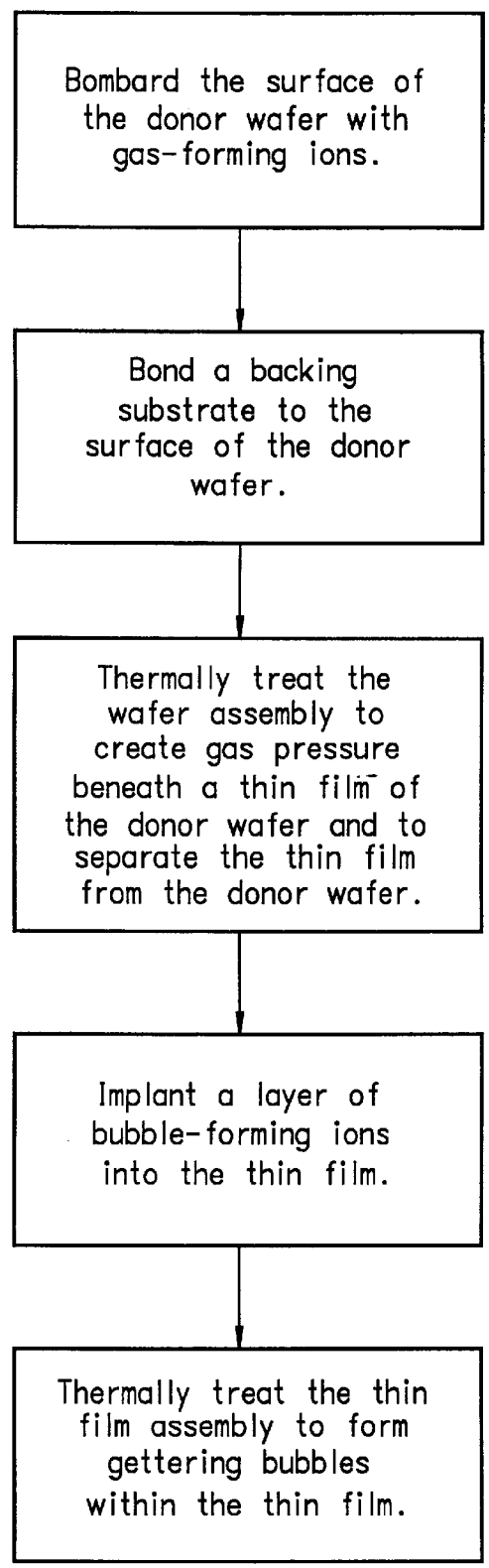
FIG. 5 simplified flow chart of a process in accordance with FIGS. 4A–4E.

FIG. 4A shows a monocrystalline donor wafer 410 with a blister layer 411. The blister layer was formed by implanting hydrogen into the donor wafer, which is oriented such that a crystalline plane, or cleavage plane, is approximately parallel to the blister layer. For example, a dose of about $10^{16}$ cm$^{-2}$ hydrogen ions implanted into a {100} silicon wafer at 150 keV formed a blister layer approximately 1.2 μm below the top surface 412 of the donor wafer 410. The implanted hydrogen ions may capture electrons to form hydrogen atoms, which in turn form diatomic hydrogen gas. The hydrogen gas starts to form a layer of bubbles in the blister layer, which is parallel to a cleaving plane of the donor wafer. As gas pressure builds within the blister layer, a thin layer of the donor wafer will split off along the cleavage plane. The donor wafer may include a thin layer of silicon oxide (not shown) on its top surface to encapsulate the silicon and to assist in the wafer bonding process. The hydrogen may be implanted through this layer of oxide.

While gases other than hydrogen may be used, such as helium, neon, krypton, and xenon, hydrogen is advantageous. The braking process of hydrogen ions in silicon is an electronic, rather than nuclear, phenomena. This allows for a relatively high dosage to be implanted with relatively little damage to the silicon lattice, as compared to implanting similar doses of heavier ions. The electronic braking also provides a smaller range of distribution of implanted ions than would typically be obtained when implanting a heavier ion. This makes it possible to obtain suitable blister formation at a moderate implanted dose, and to separate a layer of silicon with a relatively smooth surface.

The thickness of the thin layer may be determined by appropriately choosing the implant energy. The expected thickness in {100} silicon has been calculated using the public-domain "TRIM" modeling software developed by J. Zeigler, as shown in Table 1.

TABLE 1

| ENERGY (keV) | 10 | 50 | 100 | 150 | 200 | 500 | 1000 |
|---|---|---|---|---|---|---|---|
| Film Thickness (μm) | 0.14 | 0.5 | 0.88 | 1.27 | 1.72 | 5.59 | 15.67 |

Figure 4B:
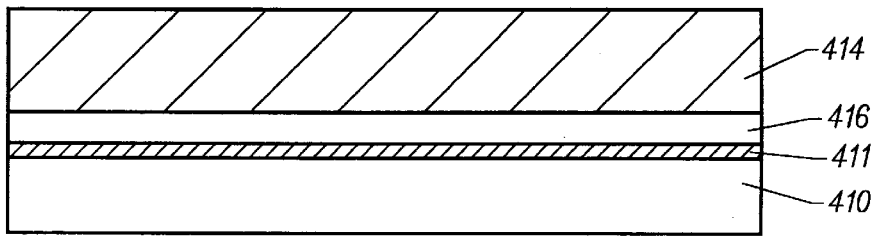

FIG. 4B shows a backing substrate 414 bonded to the donor wafer 410. The backing substrate provides support to a thin film 416 of silicon that will be blistered off of the donor wafer. The backing substrate also provides a layer of insulation underneath the thin layer of silicon, such as a layer of dielectric material or insulating adhesive on the backing substrate, or the entire backing substrate may be insulating, such as if it were made of fused silica or glass. The backing substrate may be any of a variety of materials, but a silicon wafer with a layer of thermally grown oxide (not shown) provides a desirable backing substrate for use with a thin layer of silicon because of the substrate's thermal expansion coefficient and bonding properties. The donor wafer may be bonded to the backing substrate by a variety of methods, including applying an electrostatic voltage across the layer of thermally grown oxide on the backing substrate. For example, if the thermally grown oxide layer is 5,000 Å thick, then applying several dozen volts across the dielectric layer or layers, produces pressures in the range of one million Pascals between the donor wafer and the backing substrate. Appropriately heat treating the wafer assembly causes the hydrogen gas to coalesce into a blister, separating the top 1.2 μm of silicon (thin film 416) from the donor wafer.

Figure 4C:
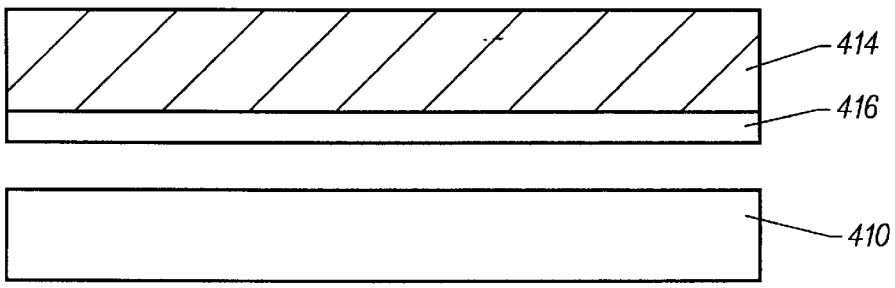

FIG. 4C shows the thin film of silicon 416 separated from the donor wafer 410 and bonded to the backing substrate 414.

Figure 4D:
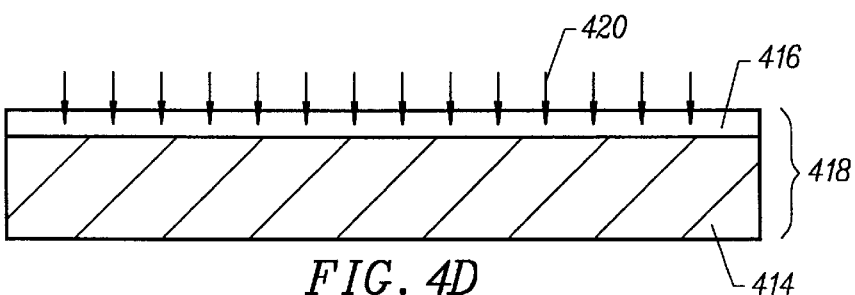

FIG. 4D shows the thin film of silicon 416 bonded to the backing substrate 414, the both of which form an SOI wafer 418. Gas-forming particles or precipitate forming particles 420 are implanted into the thin film of silicon, as discussed above. These particles may not significantly react with the substrate that they are implanted into, but rather form gas pockets, or microbubbles, within the substrate after suitable thermal treatment. Examples of gas-forming particles include hydrogen ions and ions formed from the noble gases, including helium, neon, argon, krypton, and xenon. These pockets or microbubbles provide trapping sites for impurities. It is believed that the internal surfaces of these microbubbles provide a lower energy state for impurities, and also that the formation of the bubbles may create localized crystalline defects, providing further trapping sites. It has been estimated that the interior surface of a microbubble may trap a copper impurity ion by providing a site that is about 2.2 eV lower in energy than the bulk solution site for copper ions.

Figure 4E:
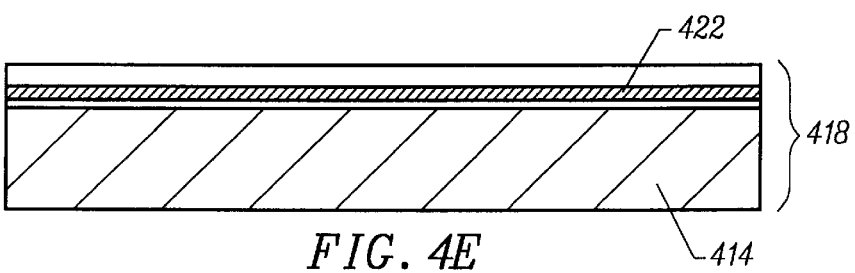

FIG. 4E shows the SOI wafer 418 after a thermal treatment that has caused the gas-forming particles to form a gettering layer 422. It is understood that the gettering layer 422 is a region of gettering sites within the wafer and that characterizing this region as a layer is done for illustrative purposes only. The distribution of these gettering sites depends upon the energies used to implant the gas-forming particles, among other factors. In this instance, the gettering layer is made up of several microbubbles, similar to those shown in FIG. 3. The exact choice of ion dosage and energy to form the gettering layer depends upon many factors, including the depth of the insulative layer, the type of semiconductor material the gettering layer is to be formed in, the bubble-forming species, and the intended device type and active region, among other factors. As an example, $1 \times 10^{17}$ cm$^{-2}$ helium ions implanted into a {100} silicon wafer at 30 keV and annealed for one-half hour at 700° C. resulted in a layer of microbubbles in the silicon wafer about 0.3 μm below the top surface of the wafer. The bubbles had an average diameter of about 8 nm. Annealing for longer periods of time or at a higher temperature resulted in larger bubbles being formed, resulting in a reduction of total microbubble surface area. High-temperature annealing also generally reduces the dislocations, stacking faults, and other crystal imperfections associated with microbubble gettering. The implantation of gas-forming ions, as well as the implantation of insulator-forming ions, may be performed by a variety of means, including ion beam implantation, plasma immersion ion implantation (PIII), and ion shower implantation.

The ions or particles can be implanted into region 422 using a pattern. For example, the pattern can be formed by a "shadow" mask or masking and photolithography steps. Additionally, a variety of patterns can be used depending upon the applications. For instance, the patterns can be in the form of a plurality of strips, numerous concentric circles, a checkerboard, and others. Alternatively, the implanted region can be specifically placed in to be non-active regions of the device. These non-active regions include, among others, field isolation oxide regions, peripheral regions of the device, and "streets." Of course, the type of pattern used depends highly upon the application.

III. Wafer-bonded SOI Wafer with a Polysilicon Gettering Layer

FIGS. 6A–6E are simplified cross sections of an SOI wafer with a gettering layer being fabricated according to a wafer bonding process. A wafer bonding process involving an implantation blister method is described, but it is understood that other wafer bonding methods, such as slicing and backlapping or etch-back, may be used. The process sequence is summarized in the simplified flow chart shown in FIG. 7.

Figure 6A:
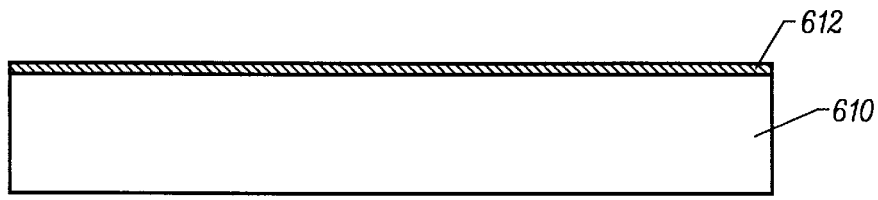
FIGS. 6A–6E are simplified cross sections of an SOI wafer being fabricated with a gettering layer of polysilicon, the SOI process including blister separation and wafer bonding steps.
Figure 7:
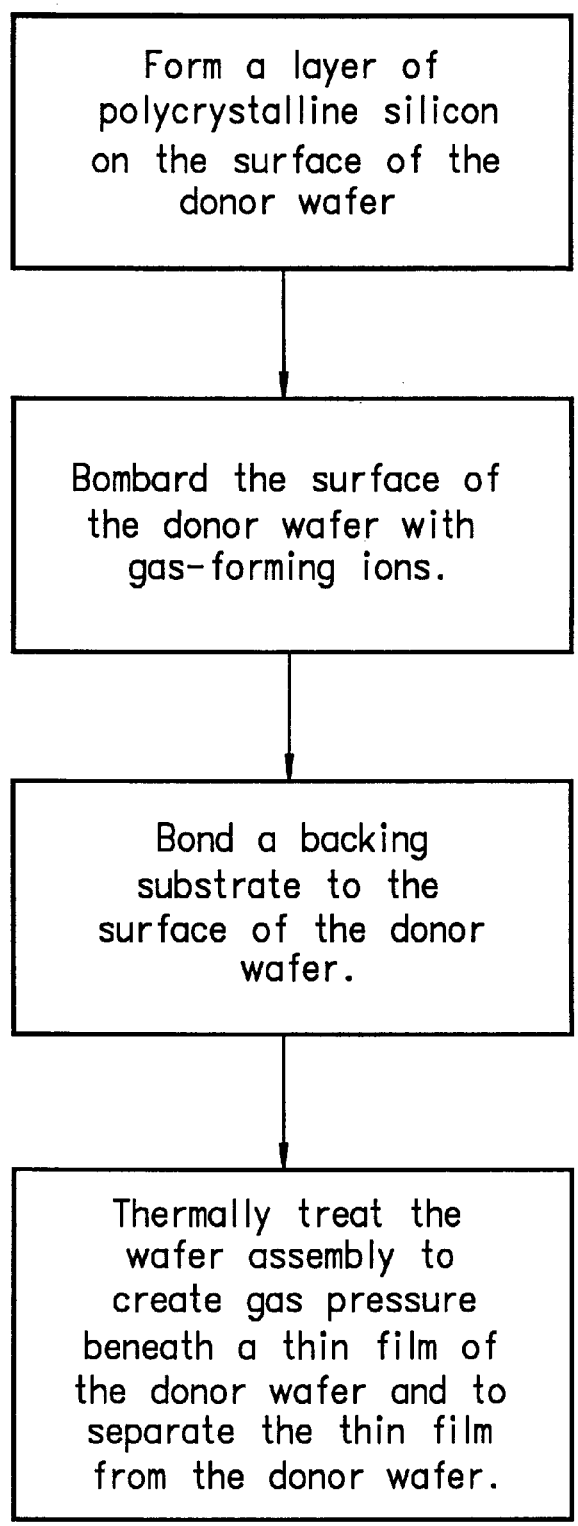
FIG. 7 is a simplified flow chart of a process in accordance with FIGS. 6A–6E.

FIG. 6A shows a monocrystalline silicon donor wafer 610 with a layer of polycrystalline silicon, also known as polysilicon, 612 forming the top surface. The polycrystalline silicon layer may be formed by a variety of conventional means, and will eventually become a gettering layer in an SOI wafer. It is understood that a layer of amorphous silicon could be formed instead of the polysilicon layer, but polysilicon layers typically have small grains, which are advantageous for gettering impurities.

Figure 6B:
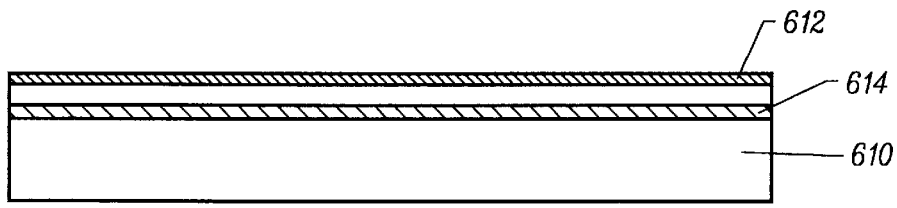

FIG. 6B shows the donor wafer 610 with a blister layer 614. The blister layer was formed as-described above in reference to FIG. 4A.

Figure 6C:
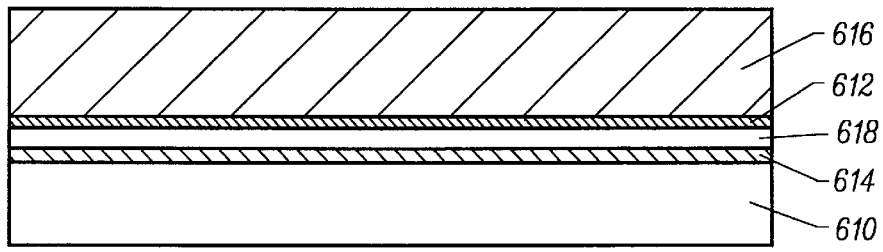

FIG. 6C shows a backing substrate 616 bonded to the polysilicon layer 612. The polysilicon layer 612 lies between a thin film of monocrystalline silicon 618 and the backing substrate 616. The backing substrate was bonded to the donor wafer as-described above in reference to FIG. 6B.

Figure 6D:
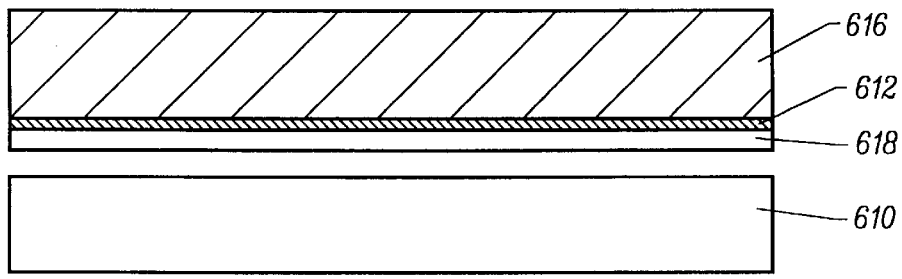

FIG. 6D shows the thin film of monocrystalline silicon 618 separated from the donor wafer 610. The thin film of monocrystalline silicon was separated from the donor wafer according to methods as-described above in reference to FIG. 4C.

Figure 6E:
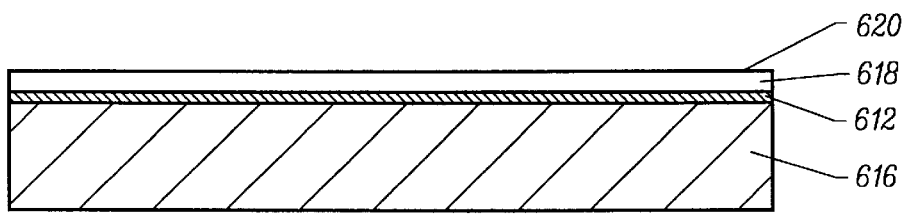

FIG. 6E shows an SOI wafer with a backing substrate 616, a gettering layer 612 of polycrystalline silicon, which may be patterned, and thin film of monocrystalline silicon 618 with a top surface 620. The grain boundaries and high degree of lattice disorder in the polysilicon act as sinks for mobile impurities. The polysilicon layer provides gettering sites that differ from the sites provided by microbubbles. For example, the grain boundaries and lattice disorder associated with polysilicon do not anneal out at the same time-temperature product as some of the gettering sites provided by microbubbles. The polysilicon layer may further include impurities, such as oxygen or other precipitate-forming impurities, or lattice-strain-inducing impurities, such as phosphorous, as is known in the art, to further improve the effectiveness of the gettering layer.

IV. SOI Device with a Plurality of Gettering Layers

Figure 8:
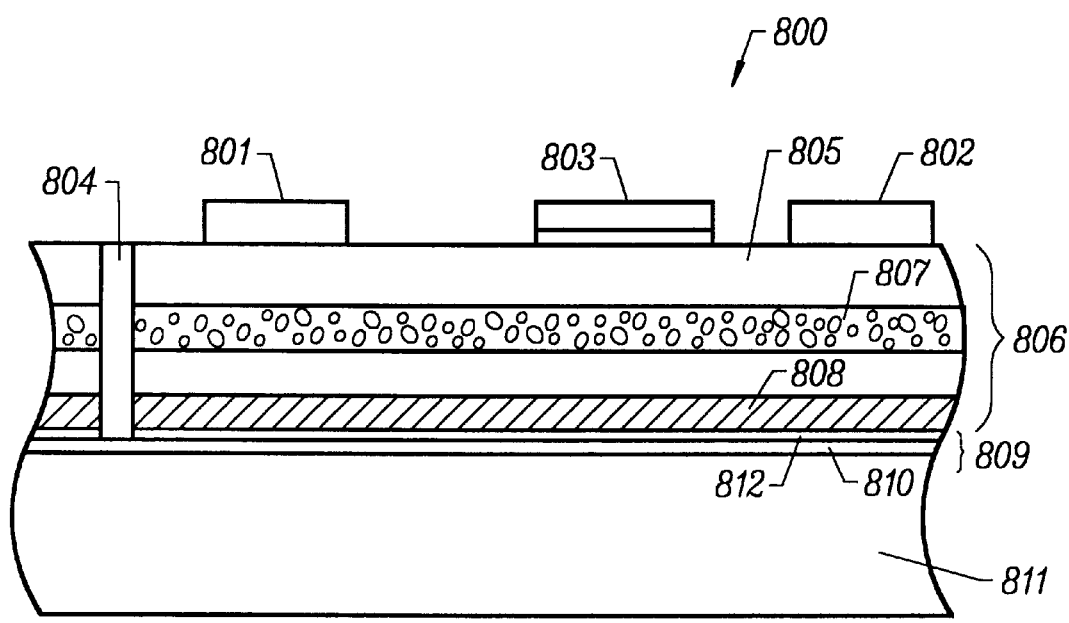
FIG. 8 is a simplified cross section of an FET device with various gettering layers fabricated on a SOI wafer.

FIG. 8 is a simplified cross section of a device 800 fabricated on an SOI wafer. In this instance, the device 800 is a field-effect transistor (FET), with a source contact 801 a drain contact 802 and a gate contact 803. An oxide-filled trench 804 provides isolation from an adjacent device (not shown). The FET operates in an active region 805 of a silicon layer 806. The active region 805 overlies a first gettering layer 807 of microbubbles, which can be patterned. A second gettering layer 808 of polysilicon, which also can be patterned, is also shown. It is understood that a device may be fabricated with only one gettering layer. An insulating layer 809 underlies the active region 805 and the gettering layers 808, 808. The insulating layer is made of a first layer of silicon oxide 810 formed on the silicon backing substrate 811 and a second layer of silicon oxide 812 formed on the polysilicon layer 808. It is understood that the insulating layer may be a single layer, or that the backing substrate may be insulating, as discussed above.

V. Gettering Layers Below and within the Insulating Layer

Figure 9A:
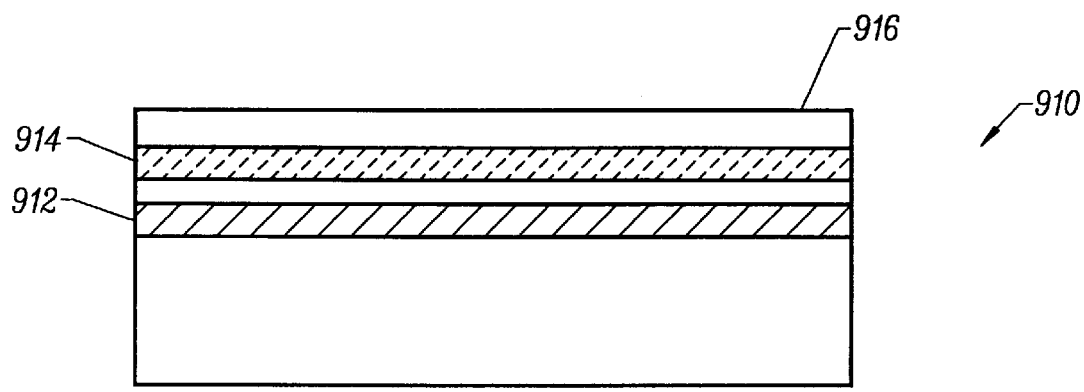
FIG. 9A is a simplified cross section of an SOI wafer with a gettering layer disposed below an insulating layer.

FIG. 9A is a simplified cross section of an SOI wafer 910 with a gettering layer 912, which can be patterned, disposed below an insulating layer 914. The insulating layer may be a SIMOX-type layer, for example, with a layer of semiconductor material 916 above the insulating layer, as discussed above. In this instance, the insulating layer passes the impurities that the gettering layer removes from the semiconductor material.

Figure 9B:
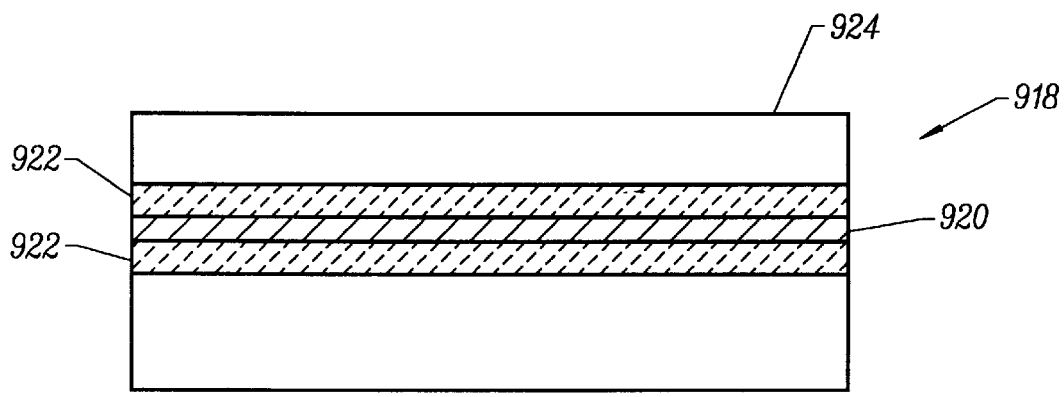
FIG. 9B is a simplified cross section of an SOI wafer with a gettering layer disposed within an insulating layer.

FIG. 9B is a simplified cross section of an SOI 918 wafer with a gettering layer 920, which can be patterned, formed within an insulating layer 922. The insulating layer passes the impurities that the gettering layer removes from the overlying semiconductor material 924. In an alternative embodiment, the gettering layer is co-extensive with the insulating layer. In other words, the insulating layer getters impurities from the semiconductor material.

Figure 9C:
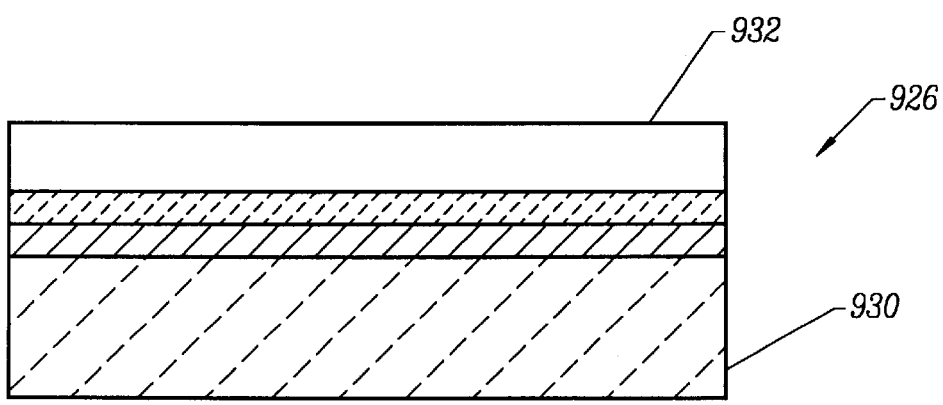
FIG. 9C is a simplified cross section of an SOI wafer with a gettering layer disposed within a insulating material bonded to a semiconductor layer.

FIG. 9C is a simplified cross section of an SOI wafer 926 with a gettering layer 928 (which can be patterned) disposed within an insulating material 930 that is bonded to semiconductor material 932. The insulating material passes impurities from the semiconductor material to the gettering layer to lower the impurity concentration in the gettering layer. In an alternative embodiment, the insulating material acts as a gettering material and is bonded to the semiconductor in a manner allowing transport of impurities from the semiconductor material to the gettering material.

While the above is a complete description of specific embodiments of the present invention, various modifications, variations, and alternatives may be employed. For example, a silicon alloy may be substituted for the polysilicon gettering layer. Furthermore, the donor wafer does not have to be silicon, but could be another semiconductor material, such as germanium, silicon carbide, silicon-germanium alloy, or a heterostructure, among others. In such an instance, the gettering layer material would be chosen such that it is appropriate according to the principles discussed above. That is, the gettering layer would be chosen so that it provided an impurity sink in relation to the material used in the active region of devices. Additionally, it is apparent that the getter layer can be disposed in a variety of locations from the above descriptions. For example, the getter layer can be disposed in the insulating layer, under the insulating layer, or over the insulating layer in the SOI wafer structure. The getter layer can also be patterned, as noted above. Other variations will be apparent to persons of skill in the art.

These equivalents and alternatives are intended to be included within the scope of the present invention. Therefore, the scope of this invention should not be limited to the embodiments described, and should instead be defined by the following claims.

What is claimed is:

1. A wafer comprising:
   a substrate;
   a cleaved semiconductor layer disposed on the substrate, the semiconductor layer having a top surface, the semiconductor layer being bonded to the substrate to form a multilayered substrate structure; and
   a gettering layer disposed between the substrate and the top surface of the semiconductor layer wherein the gettering layer provides trapping sites for a plurality of mobile impurity species;
   wherein the gettering layer comprises microbubbles or precipitates to trap a portion of said mobile impurity species.

2. The wafer of claim 1 wherein the semiconductor layer comprises monocrystalline silicon and the gettering layer comprises polycrystalline silicon.

3. The wafer of claim 1 wherein the gettering layer comprises silicon alloy.

4. The wafer of claim 1 wherein the semiconductor layer comprises germanium.

5. The wafer of claim 1 wherein the substrate comprises silicon.

6. The wafer of claim 1 wherein the microbubbles were formed by implanting gas-forming particles into the semiconductor layer.

7. The wafer of claim 6 wherein the gas-forming particles comprise hydrogen ions.

8. The wafer of claim 6 wherein the gas-forming particles are implanted into the semiconductor layer using a plasma immersion ion implantation technique.

9. The wafer of claim 1 wherein the precipitates are within the semiconductor layer.

10. The wafer of claim 9 wherein the precipitates were formed by implanting precipitate-forming particles into the semiconductor layer.

11. The wafer of claim 10 wherein the precipitate-forming particles comprise oxygen.

12. The wafer of claim 1 wherein the semiconductor layer was separated from a donor wafer by an implantation blister process.

13. The wafer of claim 12 wherein the implantation blister process included ion beam implantation.

14. The wafer of claim 12 wherein the implantation blister process included plasma immersion ion implantation.

15. A wafer comprising:
    a first region of cleaved semiconductor material;
    a second region of semiconductor material having a top surface;
    an insulative layer disposed between the first region of semiconductor material and the second region of semiconductor material, the insulating layer being bonded to the first region of semiconductor material; and
    a gettering layer disposed within the second region of semiconductor material between the top surface and the insulative layer;
    wherein the gettering layer comprises microbubbles or precipitates.

16. The wafer of claim 15 wherein the insulative layer is formed by implanting oxygen into the wafer.

17. The wafer of claim 15 wherein the oxygen is implanted by a plasma immersion ion implantation process.

18. The wafer of claim 15 wherein the semiconductor material is silicon.

19. The wafer of claim 15 wherein the microbubbles were formed by implanting gas-forming particles into the second region of semiconductor material.

20. The wafer of claim 19 wherein the gas-forming particles comprise hydrogen ions.

21. The wafer of claim 19 wherein the gas-forming particles were implanted by a plasma immersion ion implantation process.

22. A semiconductor device comprising:
    an active region comprising a cleaved substrate region;
    an insulative layer bonded to the active region; and
    a first gettering layer disposed between the active region and the insulative layer; and
    a second gettering layer of microbubbles disposed between the active region and the first gettering layer.

23. The device of claim 22 wherein the active region comprises monocrystalline silicon, the insulative layer comprises silicon oxide, and the first gettering layer comprises polysilicon.

24. The device of claim 22 wherein the first gettering layer comprises microbubbles.

25. A semiconductor-on-insulator wafer comprising:
    a cleaved semiconductor layer;
    an insulating layer disposed adjacent to and bonded to the semiconductor layer; and
    a gettering layer disposed below the insulating layer;
    wherein the gettering layer comprises microbubbles or precipitates to trap mobile ions from the semiconductor layer.

26. A semiconductor-on-insulator wafer comprising:
    a semiconductor layer;
    an insulating region disposed adjacent to and bonded to the semiconductor layer such that impurities from the semiconductor layer are gettered by the insulating region;
    wherein the insulating region comprises microbubbles or precipitates to trap mobile impurities from the semiconductor layer.

* * * * *